(12) United States Patent
Gradinger et al.

(10) Patent No.: US 12,016,162 B2
(45) Date of Patent: Jun. 18, 2024

(54) ELECTRIC POWER CONVERTER DEVICE WITH IMPROVED INTEGRATION OF COOLER FRAME

(71) Applicants: AUDI AG, Ingolstadt (DE); Hitachi Energy Switzerland AG, Baden (CH)

(72) Inventors: Thomas Gradinger, Aarau Rohr (CH); Jürgen Schuderer, Zürich (CH); Felix Traub, Birmenstorf (CH); Chunlei Lui, Oberrohrdorf (CH); Fabian Mohn, Ennetbaden (CH); Daniele Torresin, Baden (CH)

(73) Assignees: AUDI AG, Ingolstadt (DE); Hitachi Energy Switzerland AG, Baden (CH)

( * ) Notice: Subject to any disclaimer, the term of this patent is extended or adjusted under 35 U.S.C. 154(b) by 379 days.

(21) Appl. No.: 17/434,546

(22) PCT Filed: Feb. 25, 2020

(86) PCT No.: PCT/EP2020/054828
§ 371 (c)(1),
(2) Date: Aug. 27, 2021

(87) PCT Pub. No.: WO2020/173899
PCT Pub. Date: Sep. 3, 2020

(65) Prior Publication Data
US 2022/0142015 A1  May 5, 2022

(30) Foreign Application Priority Data
Feb. 28, 2019 (EP) ..................... 19160101

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC .............. H05K 7/20927; H01L 23/473–4735
See application file for complete search history.

(56) References Cited

U.S. PATENT DOCUMENTS

2010/0127371 A1* 5/2010 Tschirbs ............... H05K 1/142
257/E23.083
2011/0304039 A1 12/2011 Miyamoto
(Continued)

FOREIGN PATENT DOCUMENTS

CN 102683301 A 9/2012
CN 103228388 A 7/2013
(Continued)

OTHER PUBLICATIONS

Extended European Search Report issued on Aug. 7, 2019 in corresponding European Application No. 19160101.2; 9 pages.
(Continued)

*Primary Examiner* — Jay C Chang
*Assistant Examiner* — Mikka Liu
(74) *Attorney, Agent, or Firm* — Maier & Maier, PLLC (57) ABSTRACT

An electric power converter device includes a first power semiconductor module and a frame for a closed cooler. The first power semiconductor module includes a first base plate having a first main side, a second main side opposite the first main side and a lateral side surface extending along a circumferential edge of the first base plate and connecting the first and the second main side. The frame is attached to the second main side of the first base plate. The first base plate has a first step on the second main side along the circumferential edge of the first base plate to form a first
(Continued)

recess along the circumferential edge of the first base plate, in which first recess a first portion of the frame is received.

14 Claims, 8 Drawing Sheets

(56) References Cited

U.S. PATENT DOCUMENTS

| | | | |
|---|---|---|---|
| 2012/0235293 A1* | 9/2012 | Jones | H01L 23/473 |
| | | | 257/E23.098 |
| 2013/0228322 A1 | 9/2013 | Yasuda et al. | |
| 2015/0097281 A1 | 4/2015 | Adachi | |
| 2015/0380338 A1* | 12/2015 | Hori | H01L 25/073 |
| | | | 257/693 |

FOREIGN PATENT DOCUMENTS

| | | |
|---|---|---|
| DE | 102009045063 A1 | 3/2011 |
| EP | 3276657 A1 | 1/2018 |
| JP | 2008270297 A | 11/2008 |
| JP | 2009-295808 A | 12/2009 |
| JP | 2010-199494 A | 9/2010 |
| JP | 2013030649 A | 2/2013 |
| JP | 5541393 B2 | 7/2014 |
| JP | 2014183058 A | 9/2014 |
| JP | 5659935 B2 | 1/2015 |
| JP | 2015050465 A | 3/2015 |
| JP | 2016-001766 A | 1/2016 |
| JP | 2016039224 A | 3/2016 |
| JP | 2017054967 A | 3/2017 |

OTHER PUBLICATIONS

International Search Report and Written Opinion issued on May 8, 2020 in corresponding International Application No. PCT/EP2020/054828; 14 pages.

International Preliminary Report on Patentability issued on Jan. 22, 2021 in corresponding International Application No. PCT/EP2020/054828; 6 pages.

Office Action issued on Jul. 18, 2023, in corresponding Chinese Application No. 202080016946.0, 14 pages.

Office Action issued on Jan. 16, 2024, in corresponding Japanese Application No. 2021-551583, 8 pages.

* cited by examiner

ELECTRIC POWER CONVERTER DEVICE WITH IMPROVED INTEGRATION OF COOLER FRAME

FIELD

The present invention relates to an electric power converter device according to the preamble of claim 1.

BACKGROUND

Direct water-glycol cooling of power semiconductor modules included in the electric power converters is common for use in harsh operating conditions. This is due to superior performance of direct cooling. Direct cooling means that a base plate of the power semiconductor module is in direct contact with the cooling fluid and contains a surface extension, typically in the form of pins.

In a known electric converter, the substrate(s) of one or more power semiconductor devices is (are) placed on a common baseplate and a top side frame is screwed and glued to the top side of the baseplate. Resin is then potted into the frame for encapsulation of the one or more power semiconductor devices in one power semiconductor module. In order to prevent any leakage issues of cooling water and to avoid extensive use of screws, there is also a trend away from the open pin-fin base plate (which has to be sealed at a bottom side of the base plate by a screwed O-ring connection) approaches towards to a closed metal cooler being integrated with the power semiconductor module.

Transfer-molded and sintered packages of power modules have become an interesting alternative to the traditional approach for encapsulation of power semiconductor devices by potting as described above. Sintering and mold compound encapsulation can significantly increase the cycle reliability of the power module. In addition, the module sintering in one step and the transfer molding approach can significantly reduce the manufacturing costs and the bill of material of the module.

In the electric power semiconductor modules the transfer of heat from the base plate and the pins to the cooling fluid is most critical for the performance of the direct cooling.

Also, much space is required by the known designs of an electric power converter with direct cooling.

Some electrical power converters require plural power semiconductor devices. For example in two-level three-phase traction inverters for electric vehicles, six functional semiconductor switches are needed. Therein the six functional semiconductor switches require at least six semiconductor devices (chips), but may require even more semiconductor devices since several (typically 3 to 10) devices are parallel-connected per functional semiconductor switch.

There are significant drawbacks when integrating plural power semiconductor devices within one molded and sintered module on a single common base plate. Molding across a large area is challenging because curing of the epoxy material during compound transfer limits the possible length of a molding channel, the mold compound loading volume in commercial equipment is limited, and the mismatch of the coefficient of thermal expansion (CTE) between a large area mold compound and a cooler or baseplate can lead to warpage and stresses that might impact the mechanical integrity and result in mold compound delamination. Moreover, one-step sintering of a power semiconductor module comprising plural power semiconductor devices is economically very risky, since the plural power semiconductor devices cannot be tested prior to assembly.

While substrates can be fully assembled with wire bonds when heading for successive substrate soldering, substrates for sintering cannot be wire bonded and tested prior to sintering, since the sintering approach requires a strong pressure on the substrates (typically applied mechanically with a rubber stamp) that would destroy the wire bonding.

In a known electric power converter comprising plural power semiconductor devices it may therefore be preferable to integrate the plural power semiconductor devices in plural molded or sintered power modules in a compact configuration with a single closed cooler. However integrating plural molded or sintered power modules into a compact configuration with a closed cooler requires that a fluid channel (or containment) is created around the pins of the base plate of each power module, and that the channels must be fluidly connected. This is a challenge, since the connections must be robust and tight. Also, as indicated above the design should be space saving and cheap.

From DE 10 2009 045 063 A1 there is known a power semiconductor module system comprising a power semiconductor module and an add-on heat sink element. The power semiconductor module includes a substrate, a semiconductor die on a front side of the substrate and a heat sink made of resin, which is molded to a back side of the substrate. The add-on heat sink element is attached to the power semiconductor module such that a channel for a cooling fluid is formed, wherein the cooling fluid in the channel is in direct contact with the heat sink. It is described to attach the add-on heat sink element to the power semiconductor module by a screw joint or by bonding. For sealing purposes it is described to use an O-ring provided in a groove in the heat sink or in the add-on heat sink element. A pressure drop in in the cooling fluid is relatively high in this prior art power semiconductor module system.

From JP 5659935 B2 it is known an electric power converter in which a plurality of power modules are joined to a single cooler with a solder. The design requires much space and the cooling efficiency is relatively low.

SUMMARY

In view of the above disadvantages in the prior art it is an object of the invention to provide an electric power converter device which overcomes the above disadvantages in the prior art. In particular it is an object of the invention to provide an electric power converter integrating a frame for a cooler (i.e. a cooler frame) in a space-saving manner and in such manner that a cooling efficiency can be improved.

The object is attained by an electric power converter device according to claim 1. Further developments of the invention are specified in the dependent claims.

The electric power converter device of the invention comprises a first power semiconductor module and a frame for a closed cooler. The first power semiconductor module includes a first base plate and at least one first die. The first base plate has a first main side, a second main side opposite the first main side and a lateral side surface extending along a circumferential edge of the first base plate and connecting the first and the second main side. The at least one first die is located on the first main side of the first base plate. The frame is attached to the second main side of the first base plate. The first base plate has a first step on the second main side along the circumferential edge of the first base plate to form a first recess along the circumferential edge of the first base plate, in which first recess a first portion of the frame is received.

With the first recess along the circumferential edge of the first base plate, in which the first portion of the frame is received, the frame for the closed cooler can be attached to the base plate in a space-saving manner because the first portion of the frame does not add to the total thickness of the electric power converter device. Furthermore, by providing the recess in which the first portion of the frame is received, the lower side of the first portion of the frame and that portion of the second main side of the first base plate along which a cooling fluid flows in operation of the electric power converter can be brought closer to each other in a direction perpendicular to the second main side of the first base plate, so that the cooling fluid can flow more smoothly along the lower side of the first portion of the frame and the second main side of the base plate. This results in a lower pressure drop in the cooling fluid and thereby in an improved cooling efficiency.

In an exemplary embodiment the first portion of the frame is a flange portion that is received in the first recess such that a bottom surface of the flange portion is flush with the second main side of the first base plate adjacent to the first step. In this exemplary embodiment a surface which includes the bottom surface of the flange portion and the second main side adjacent to the first step has no step but provides a smooth surface without a step, so that a resistance for the flow of a cooling fluid flowing along this surface can be minimized. This results in a low pressure drop in the cooling fluid and thereby in an improved cooling efficiency.

In an exemplary embodiment the first portion of the frame is fixed to the first base plate by a welding connection.

In an exemplary embodiment the first base plate has a reduced first thickness along its circumferential edge compared to a second thickness of the first base plate in a central area of the first base plate which central area is laterally surrounded by the first step. An advantage of the base plate having a lower first thickness along the circumferential edge due to the first step on the second main side is the possible reduction of use of material for the base plate (resulting in lower weight and cost) if the first step is directly shaped when forging the base plate. The base plate may be thick only in the area below the at least one die. In this area, the relatively high second thickness is needed for heat spreading. In the more peripheral regions, there may be no die and hence much lower losses, making heat spreading much less important. The first thickness of the first base plate is reduced there because of the first step.

In an exemplary embodiment the electric power converter device comprises a plurality of cooling extensions protruding from the second main side of the first base plate in a central area of the first base plate which central area is laterally surrounded by the first step. In this exemplary embodiment the cooling efficiency can be improved. Due to the first recess the cooling extensions close to the frame are cooled more efficiently compared to a case where the first portion would be attached to a base plate having no recess. The cooling extensions can be manufactured together with the first recess in a single manufacturing step by forging.

In an exemplary embodiment the frame has a plate portion that comprises an opening, wherein an edge of the plate portion directly adjacent to the opening and surrounding the opening is the first portion of the frame. In this exemplary embodiment the plate portion forms a flat wall portion of a channel in the closed cooler.

In an exemplary embodiment the plate portion has a third thickness which is the same as a depth of the first recess in the first base plate. In such exemplary embodiment a lower side of the plate portion is flush with the second main side of the first base plate.

In an exemplary embodiment the electric power converter device comprises a molded encapsulation, which encapsulates the first main side and the lateral side surface of the first base plate such that a bottom surface of the encapsulation is flush with the first base plate at the circumferential edge of the first base plate on the second main side. In this exemplary embodiment integration of the frame is facilitated, because a surface of the frame facing towards encapsulation and towards the first recess can be a flat surface. Moreover, forming the encapsulation is facilitated because the second main side surface in the first recess can be used as an abutment or sealing face for a mold for forming the encapsulation by molding.

In an exemplary embodiment the first base plate is made of copper (Cu), or aluminum (Al), or aluminum silicon carbide (AlSiC), or a combination of copper (Cu) and aluminum (Al). Such materials have a high thermal conductivity and high durability to withstand harsh conditions and direct contact with the cooling liquid during operation of the device.

In an exemplary embodiment the electric power converter device comprises a cooler cover attached to the frame at a side opposite to the first base plate to form a bottom wall portion of a fluid channel in the closed cooler.

In an exemplary embodiment the electric power converter device comprises at least one second power semiconductor module, the second power semiconductor module including: a second base plate having a third main side and a fourth main side opposite the third main side; and at least one second die located on the third main side of the second base plate, wherein the frame is attached to the fourth main side of the second base plate, and wherein the second base plate has a second step on the fourth main side along a circumferential edge of the second base plate to form a second recess along the circumferential edge of the second base plate in which a second portion of the frame is received. In this exemplary embodiment integrating the first and the second power semiconductor module with one single closed cooler is facilitated. A fluid channel (or containment) is created at the first and the second base plate, and the channels are fluidly connected in a robust and tight manner. Also, the design allows to integrate plural power semiconductor modules in a space-saving and relatively cheap manner. The second semiconductor power module may have the same features and may be integrated with the frame in the same way as described above for the first power semiconductor module, i.e. plural semiconductor power modules may have the same features and may be attached to the frame in the same way as described above for the first power semiconductor module.

In an exemplary embodiment the electric power converter device of the invention may be manufactured by a method comprising the following steps: providing a frame for a closed cooler; providing a first power semiconductor module, the first power semiconductor module including a first base plate having a first main side, a second main side opposite the first main side and a lateral side surface extending along a circumferential edge of the first base plate and connecting the first and the second main side; and at least one first die located on the first main side of the first base plate, wherein the first base plate has a first step on the second main side along the circumferential edge of the first base plate to form a first recess along the circumferential edge of the first base plate; and attaching the first power semiconductor module to the frame such that a first portion of the frame is received in the first recess and fixed to the first base plate.

With the first recess along the circumferential edge of the first base plate, in which the first portion of the frame is received, the frame for the closed cooler can be attached to the base plate in a space-saving manner, a pressure drop in a cooling fluid is reduced and cooling efficiency can be improved as discussed above.

The step of providing the first power semiconductor module may comprise molding an encapsulation, wherein the encapsulation encapsulates the first main side and the circumferential side surface of the first base plate such that a bottom surface of the encapsulation is flush with the first base plate at the circumferential edge of the first base plate; and wherein a bottom mold and a top mold is used, the bottom mold having a first flat surface which is brought into contact with a second flat surface of the first recess acting as a sealing surface during the molding step. Using the second flat surface of the first recess as a sealing surface results in a reliable sealing of the mold to form the encapsulation in a reliable manner without any compound flash or bleed at the sealing surface.

In an exemplary embodiment the frame has a plate portion that comprises an opening, wherein an edge portion of the plate portion, which is directly adjacent to the opening and which surrounds the opening, is the first portion of the frame, and wherein in the step of attaching the first power semiconductor module to the frame the first portion is fixed to the first base plate by welding or bonding. Providing the frame with a plate portion having an opening into which the first semiconductor module is inserted, such that the first portion of the frame is received in the first recess, facilitates integration of the first semiconductor module with the frame.

An exemplary embodiment comprises the additional steps of providing a second power semiconductor module, the second power semiconductor module including a second base plate having a third main side, a fourth main side opposite the third main side and a lateral side surface extending along a circumferential edge of the second base plate and connecting the third and the fourth main side; and at least one second die located on the third main side of the second base plate, wherein the second base plate has a second step on the fourth main side along the circumferential edge of the second base plate to form a second recess along the circumferential edge of the second base plate; and attaching the second power semiconductor module to the frame such that a second portion of the frame is received in the second recess and fixed to the second base plate. In this exemplary embodiment plural power semiconductor modules can efficiently be integrated with a single frame in a reliable manner. By providing the first and the second power semiconductor modules as separate parts, these power semiconductor modules can be tested prior to integration with the single frame. This results in a high yield in manufacturing the electric power converter.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF EXEMPLARY EMBODIMENTS

Figure 1A:
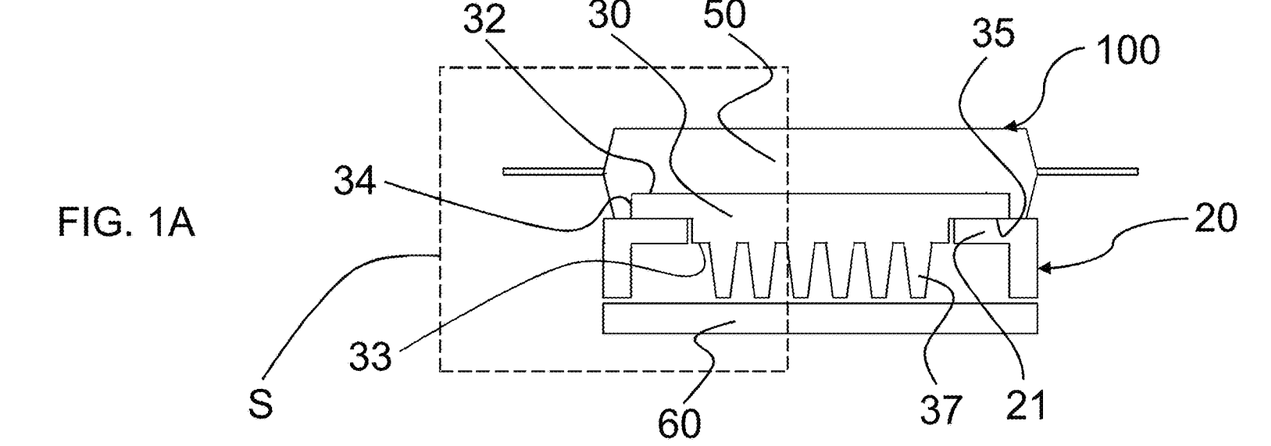
FIG. 1A shows an electric power converter device according to an embodiment in a cross-section taken along line A-A' in FIG. 1D.
Figure 1B:
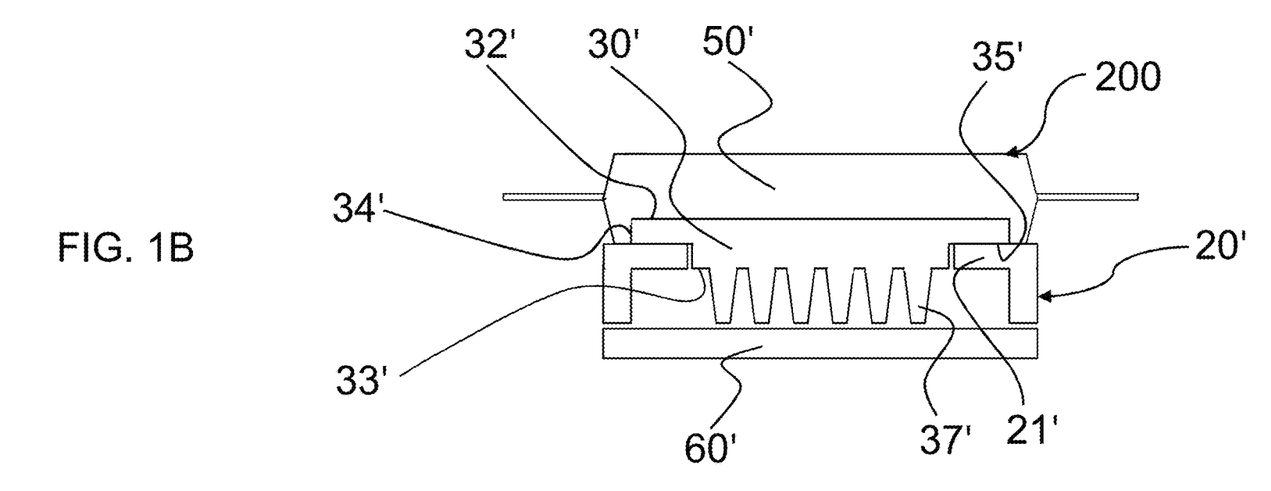
FIG. 1B shows the electric power converter device of FIG. 1A in a cross-section taken along line C-C' in FIG. 1D.
Figure 1C:
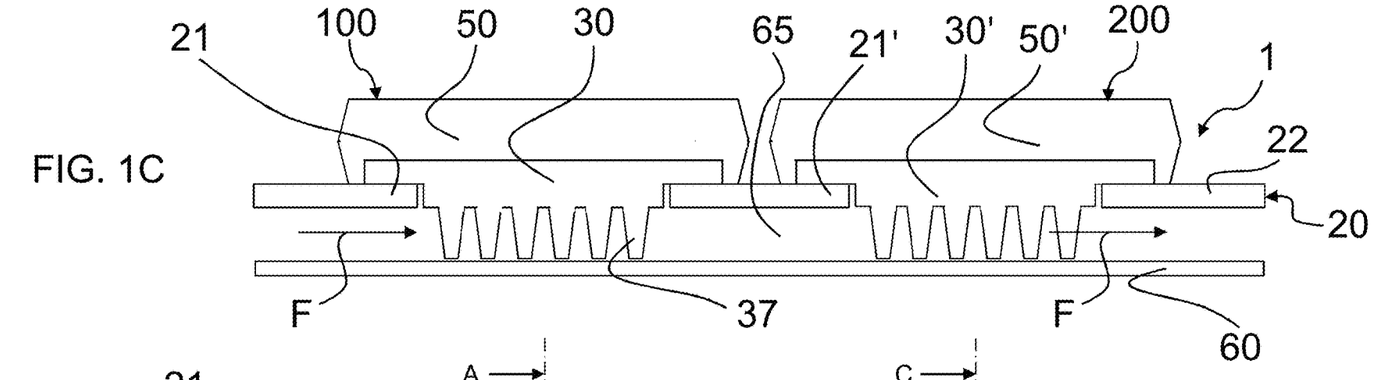
FIG. 1C shows the electric power converter device of FIG. 1A in a cross-section taken along line B-B' in FIG. 1D.
Figure 1D:
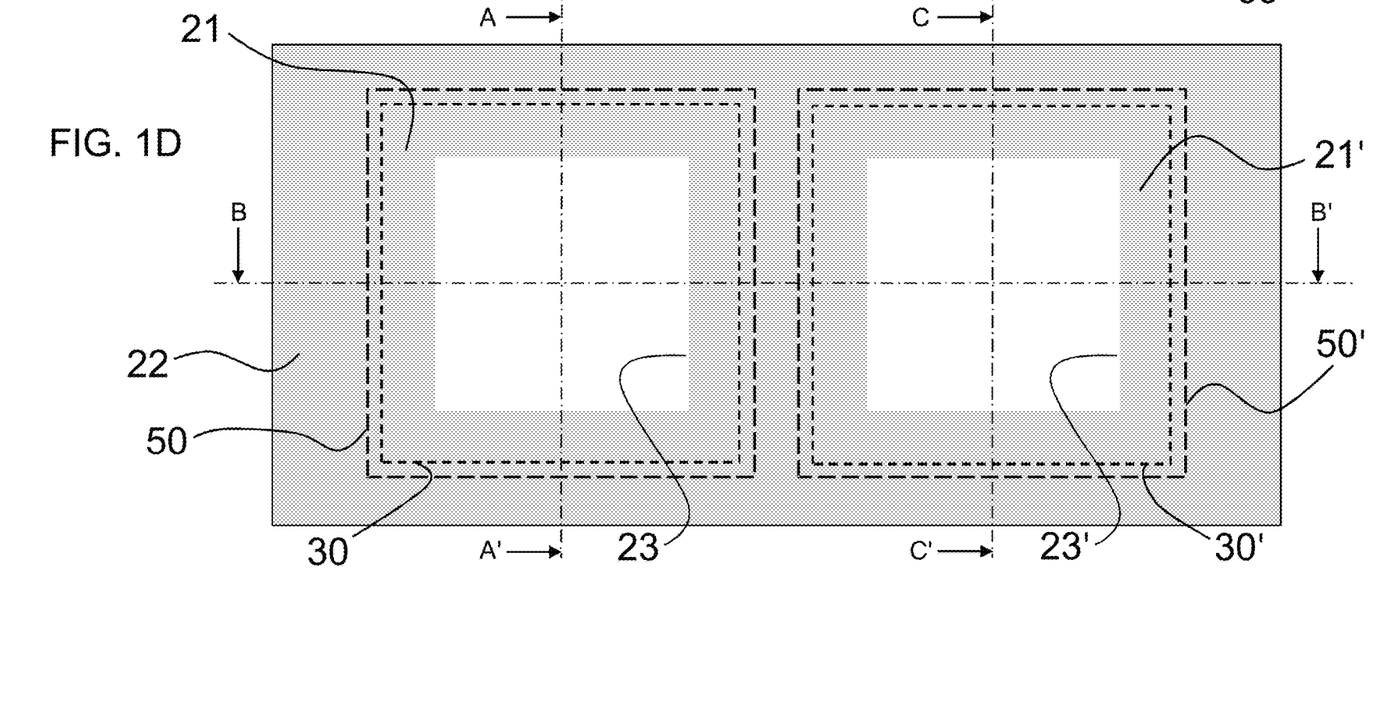
FIG. 1D shows a top view of the electric power converter device of FIG. 1A.
Figure 2:
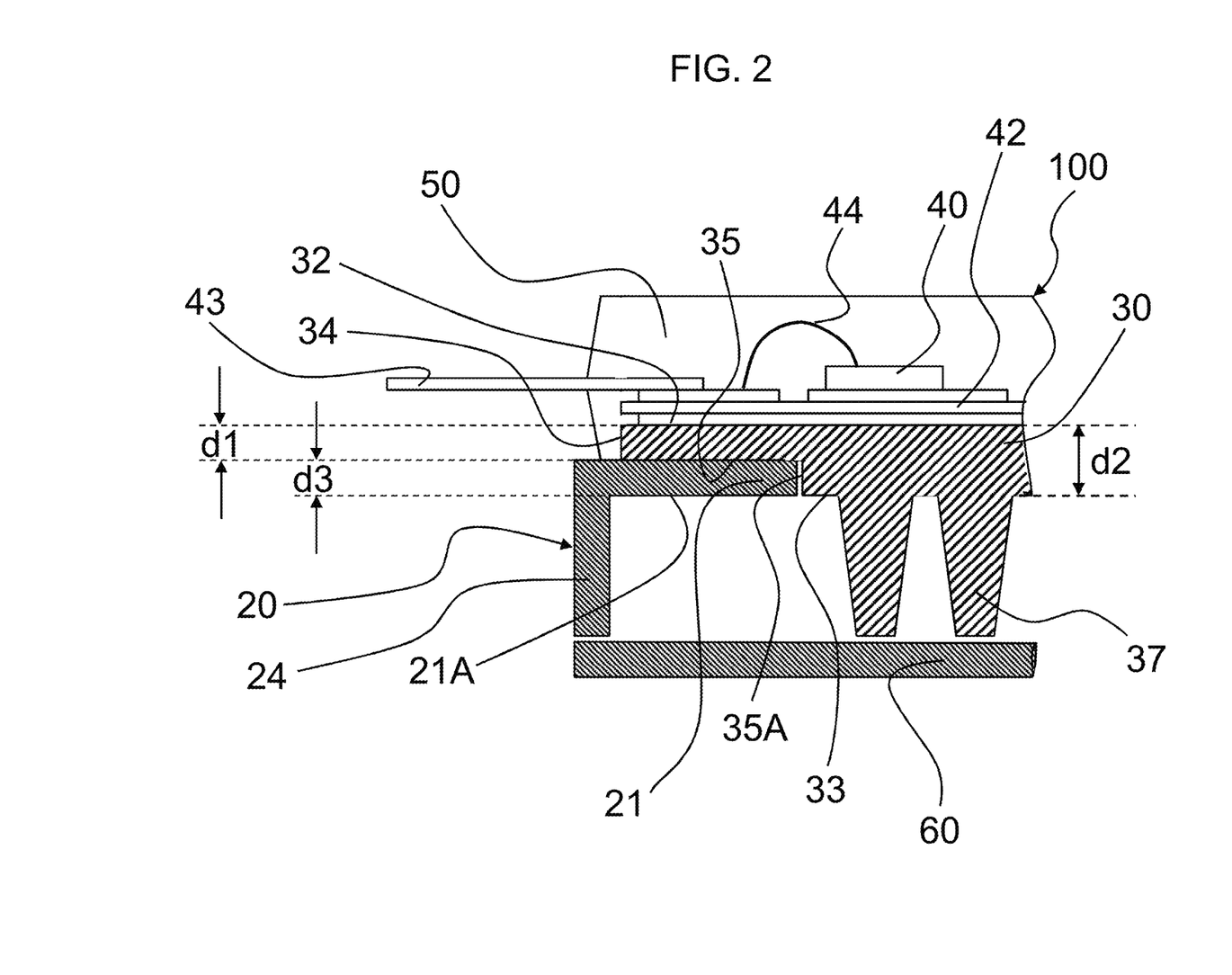
FIG. 2 shows an enlarged partial view of the cross-section shown in FIG. 1A.

In the following an electric power converter device 1 according to an embodiment of the invention is described with reference to FIGS. 1A, 1B, 1C, 1D and 2. FIG. 1D shows a top view of the electric power converter device 1. FIG. 1A shows the electric power converter device 1 in a cross-section taken along line A-A' in FIG. 1D, FIG. 1B shows the electric power converter device 1 in a cross-section taken along line C-C' in FIG. 1D and FIG. 1C shows the electric power converter device 1 in a cross-section taken along line B-B' in FIG. 1D. FIG. 2 shows an enlarged partial view of section S in the cross-section shown in FIG. 1A.

As can be seen best from FIG. 1C the electric power converter device 1 according to the embodiment comprises a first power semiconductor module 100, a second power semiconductor module 200, a frame 20 for a closed cooler, and a cooler cover 60. The first power semiconductor module 100, which is illustrated in more detail in the cross-section shown in FIG. 1A and the enlarged partial view of section S in FIG. 2, includes a first base plate 30 and at least one first die 40. The base plate 30 has a first main side 32, a second main side 33 opposite to the first main side 32 and a lateral side surface 34, which extends along a circumferential edge of the first base plate 30 and which connects the first main side 32 and the second main side 33. The at least one die 40 is located on the first main side 32 of the first base plate 30.

The first base plate 30 has a first step 35A on the second main side 33 along the circumferential edge of the first base plate 30 to form a first recess 35 along the circumferential edge of the first base plate 30. In the present embodiment first base plate 30 has a reduced first thickness d1 along its circumferential edge compared to a second thickness d2 of the first base plate 30 in a central area of the first base plate 30, which central area is laterally surrounded by the first step 35A. Accordingly, in the present embodiment the height of the first step 35A is given by the difference d2−d1 between the second thickness d2 and the first thickness d1.

The frame 20 has a plate portion 22 and a side wall portion 24 extending in vertical direction perpendicular to the first main side 32 from a circumferential edge of the plate portion 22. As shown in FIG. 1D the plate portion 22 comprises a first opening 23 and a second opening 23'. An edge portion of the plate portion 22, which is directly adjacent to the first opening 23 and which surrounds the first opening 23, is a first portion 21 of the frame 20, which is attached to the first base plate 30 of the first power semiconductor module 100 as described in more detail below. Likewise an edge portion of the plate portion 22, which is directly adjacent to the second opening 23' and which surrounds the second opening 23', is a second portion 21' of the frame 20, which is attached to a second base plate 30 of the second power semiconductor module 200 as described in more detail below.

A thickness d3 of the first portion 21 of the plate portion 22 in a direction perpendicular to the first main side 32 is substantially the same as a depth of the first recess 35, which is defined by the height d2−d1 of the first step 35A. The first portion 21 of the frame 20, which is a flange portion, is received in the first recess 35 such that a bottom surface 21A of the first portion 21 is substantially flush with the second main side 33 of the first base plate 30 adjacent to the first step 35A. In an exemplary embodiment, the whole plate portion 22 may have a constant thickness d3.

The frame 20 is attached to the second main side 33 of the first base plate 30 by the first portion 21 of the frame 20 being fixed to the first base plate 30 for example by a welding connection, by a bonding connection or by any other suitable connection.

A plurality of cooling extensions 37 protrude from the second main side 33 of the first base plate 30 in the central area of the first base plate 30 which central area is laterally surrounded by the first step 35A. Therein, a lateral direction is any direction parallel to the first main side 32.

The first base plate 30 and the cooling extensions 37 are made from any suitable material having a high thermal conductivity. Exemplarily, the first base plate 30 may be made of copper (Cu) or aluminum (Al) or aluminum silicon carbide (AlSiC) or a combination of copper and aluminum. For example, the first base plate 30 may be a two-layered base plate which has a top layer made from Cu and a bottom layer made from Al. The cooling extensions extending from the bottom layer may also be made from Al.

As illustrated in the enlarged partial view shown in FIG. 2, the first power semiconductor module 100 includes a lead frame 43 which is located together with the at least one die 40 on a substrate 42. An electrical connection between the lead frame 43 and the at least one die 40 may be provided by at least one bonding wire 44, for example. The substrate may be a direct bonded copper (DBC) substrate.

A molded encapsulation 50 encapsulates the first main side 32 and the lateral side surface 34 of the first base plate 30. As a result the at least one first die 40, the substrate 42 and the at least one bonding wire 44 is encapsulated by the encapsulation 50. A portion of the lead frame 43 which acts as a terminal of the power semiconductor module 100, protrudes from a lateral side of the encapsulation 50. A bottom surface of the encapsulation 50 is substantially flush with the first base plate 30 at the circumferential edge of the base plate 30 on the second main side 33.

The cooler cover 60 is attached to the frame 20 at a side opposite to the first base plate 30 to form a bottom wall portion of a fluid channel 65 in the closed cooler. During operation of the electric power converter device 1 a flow of a cooling fluid F through the fluid channel 65 takes places as indicated by arrows in FIG. 1C.

A first cross-section of the second power semiconductor module 200 along line FIG. C-C' in FIG. 1D is shown in FIG. 1B and a second cross-section of the second power semiconductor module 200 along line B-B' in FIG. 1D is shown in FIG. 1C. In the present embodiment the second power semiconductor module 200 is basically identical to the first power semiconductor module 100. Accordingly, for details it is referred to the above discussion of the first power semiconductor module 100. Similar to the first power semiconductor module 100, the second power semiconductor module 200 includes a second base plate 30' having a third main side 32' and a fourth main side 33' opposite to the third main side 32', and at least one second die (not shown in the figures) located on the third main side (32') of the second base plate (30').

The frame 20 is attached to the fourth main side 33' of the second base plate 30' in basically the same manner as the frame 20 is attached to the second main side 33 of the first base plate 30. In particular, the second base plate 30' has a second step on the fourth main side 33' along a circumferential edge of the second base plate 30' to form a second recess 35' along the circumferential edge of the second base plate 30' in which the second portion 21' of the frame 20 is received as shown in FIG. 1B, for example. The second recess 35' may have the same depth as the depth d2−d1 of the first recess 35 in the first base plate 30 of the first power semiconductor module 100.

In an exemplary embodiment, the above described power semiconductor modules 100, 200 may be half-bridge modules. The electric power converter device may be a traction inverter for electrical vehicles, for example.

Next a method for manufacturing the electric power converter device according to the above embodiment shown in FIGS. 1A to 2 will be described. The method comprises in general the following steps:
  (a) providing the frame 20 for a closed cooler,
  (b) providing the first power semiconductor module 100,
  (c) providing the second power semiconductor module 200,
  (d) attaching the first power semiconductor module 100 to the frame 20,
  (e) attaching the second power semiconductor module 200 to the frame 20, and
  (f) attaching the cooler cover 60 to the frame 20.

In step (a) of providing the frame 20 for a closed cooler, the frame 20 described above with reference to FIGS. 1D and 2 is provided. Accordingly, a description thereof will not be repeated but it is referred to the above description of the frame 20.

Figure 3:
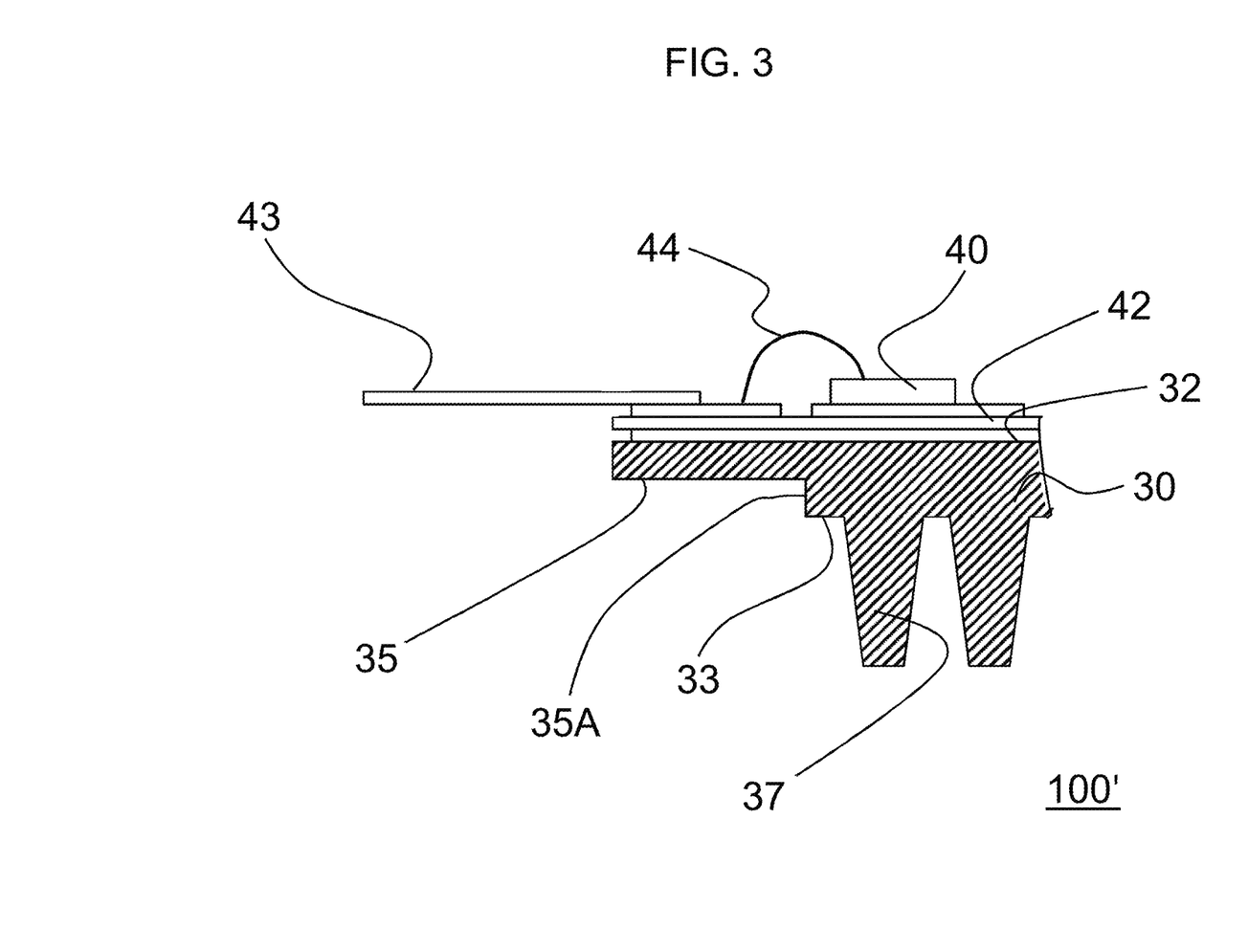
FIG. 3 shows an enlarged partial view of a power semiconductor module in cross-section illustrating a step of providing a power semiconductor module in a method for manufacturing the electric power converter device of FIG. 1A.

The step (b) of providing a first power semiconductor module 100 comprises providing a preliminary first power semiconductor module 100' as shown in FIG. 3. The preliminary first power semiconductor module 100' includes all features of the first power semiconductor module 100 as described above with reference to FIG. 2. In particular, it includes the first base plate 30, the cooling extensions 37 protruding from the second main side 33 of the first base plate 30, the substrate 42 located on the first main side of the base plate 30, the at least one first die 40 and the lead frame 43 which are located on the substrate 42 and the at least one bonding wire 44 connecting the at least one die 40 with the lead frame 43. The first base plate 30 has the first step 35A on the second main side 33 along the circumferential edge of the first base plate 30 to form the first recess 35 along the circumferential edge of the first base plate 30.

In the above step (b) the first step 35A and the first recess 35 may be formed in a same manufacturing step together with the cooling protrusions 37 by forging. In this case no additional manufacturing step is required for forming the first step 35A and the recess 35 in the first base plate 30.

Figure 4:
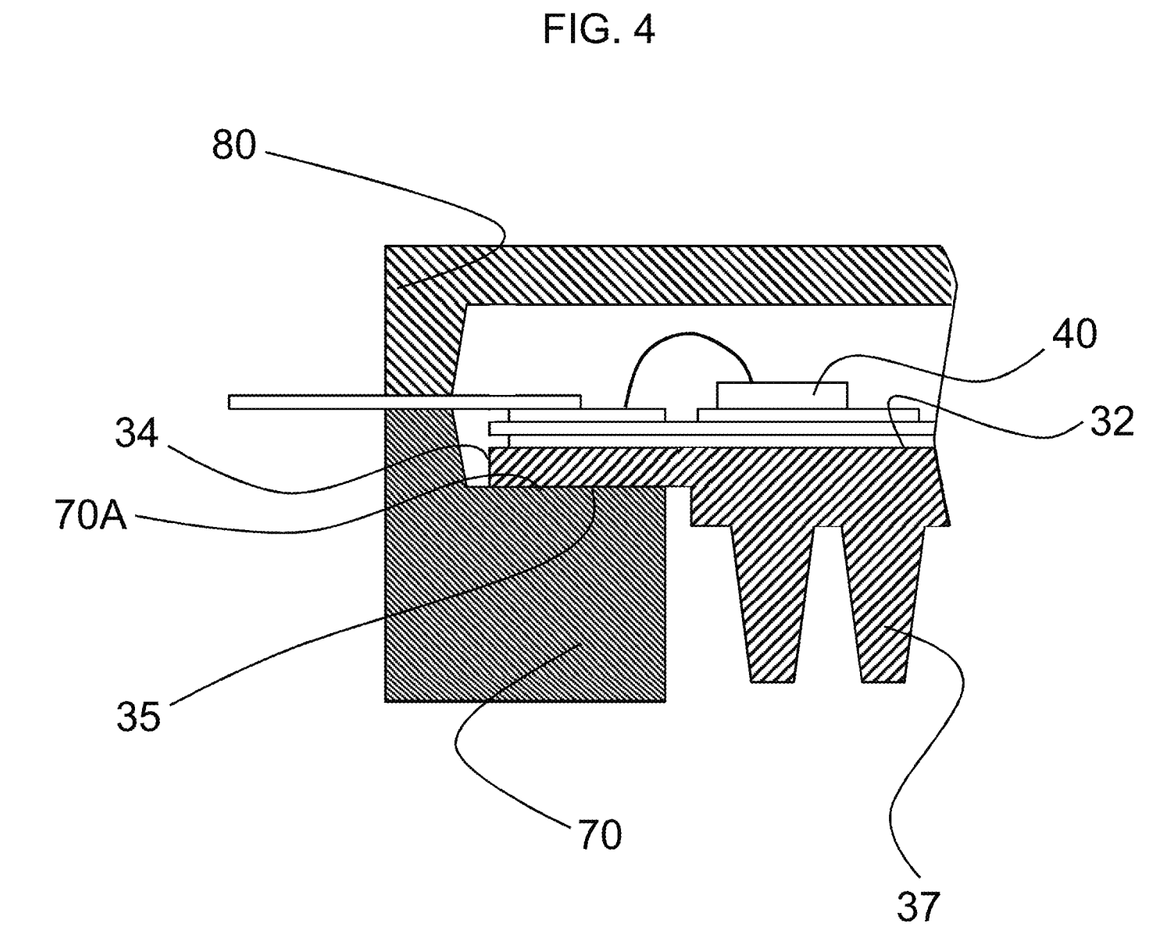
FIG. 4 shows an enlarged partial view of the power semiconductor module in cross-section illustrating a step of forming an encapsulation in a method for manufacturing the electric power converter device of FIG. 1A.
Figure 5A:
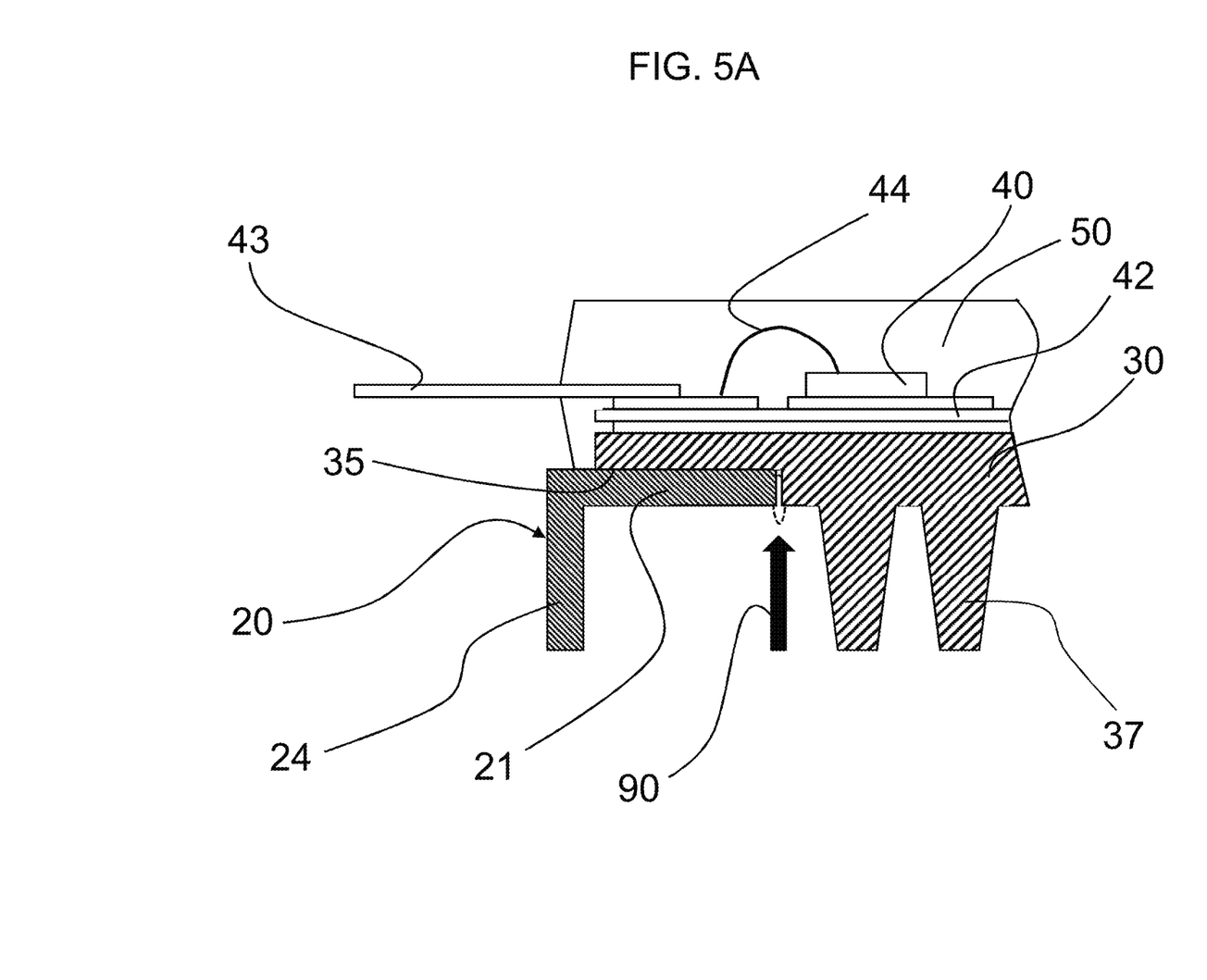
FIG. 5A shows an enlarged partial view of an electric power converter device in cross-section illustrating a step of attaching a frame to a power semiconductor module in a method for manufacturing the electric power converter device of FIG. 1A.
Figure 5B:
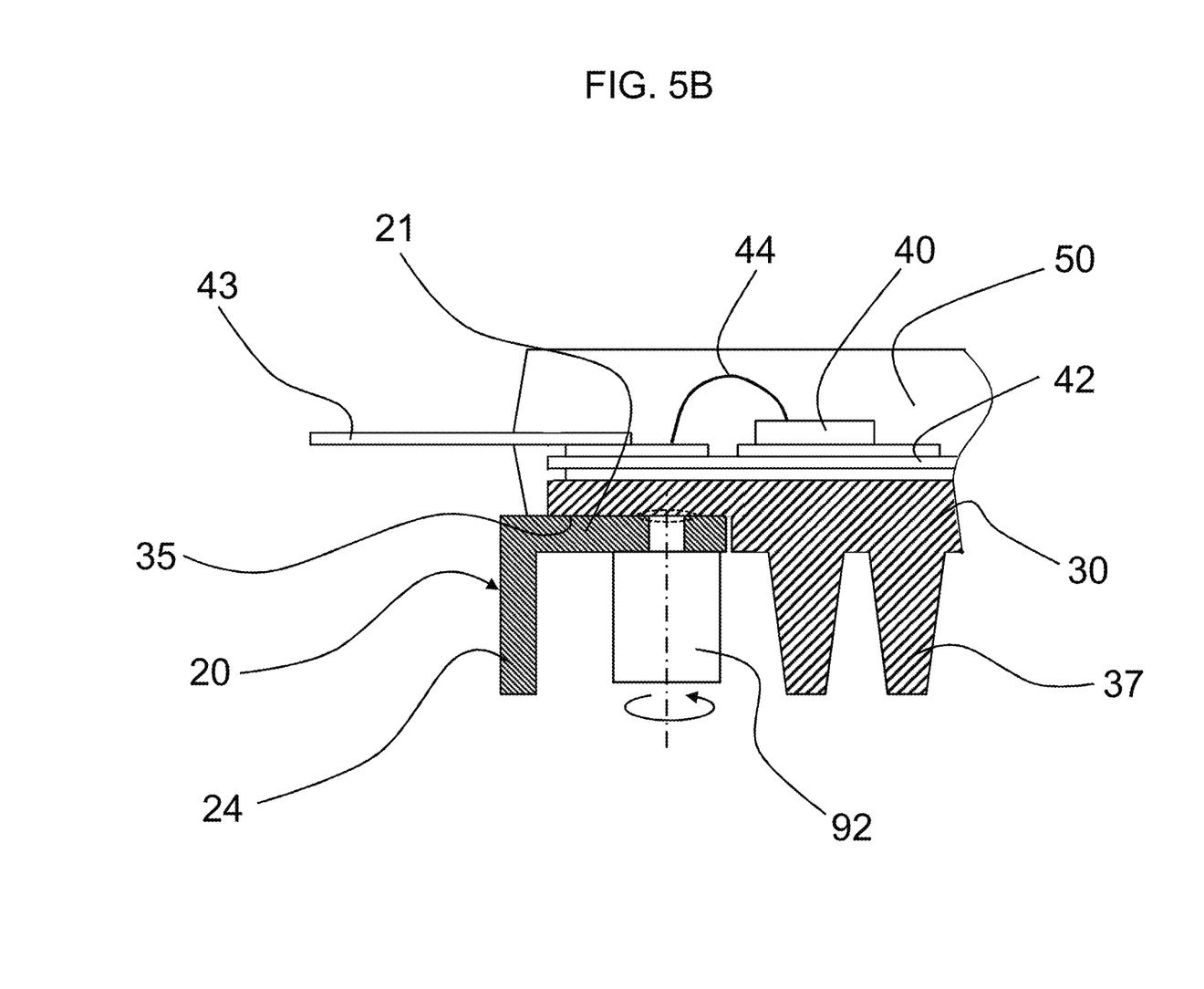
FIG. 5B shows an enlarged partial view of an electric power converter device in cross-section illustrating a step of attaching a frame to a power semiconductor module in a method for manufacturing the electric power converter device of FIG. 1A according to a modified embodiment.
Figure 5C:
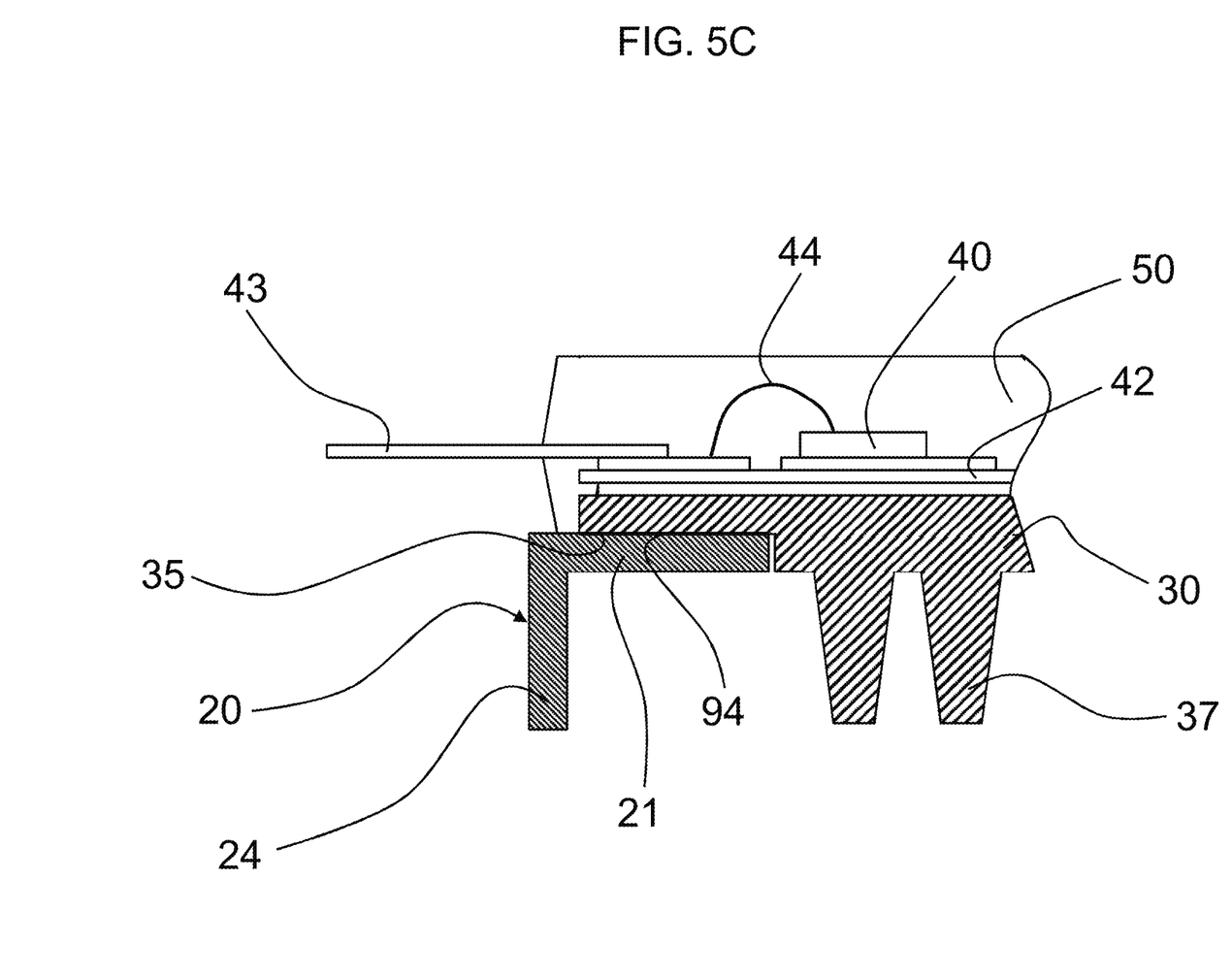
FIG. 5C shows an enlarged partial view of an electric power converter device in cross-section illustrating a step of attaching a frame to a power semiconductor module in a method for manufacturing the electric power converter device of FIG. 1A according to another modified embodiment.

Furthermore the step (b) of providing the first power semiconductor module 100 comprises a step of molding an encapsulation 50, wherein the encapsulation 50 encapsulates the first main side 32 and the circumferential side surface 34 of the first base plate 30 such that a bottom surface of the encapsulation 50 is flush with the first base plate 30 at the circumferential edge of the first base plate 30. During molding a bottom mold 70 and a top mold 80 is used, wherein the bottom mold 80 has a first flat surface 70A which is brought into contact with a second flat surface of the first recess 35 acting as a sealing surface during the molding step. By providing the flat sealing surface in the recess 35 at the second main side 33 it is ensured that the molded material cannot be formed on the cooling protrusions 37, but this results in a rim of molded material around the first base plate 30 as shown in FIGS. 5A to 5C. The terminals of lead frame 43 are provided in the splitting plane between top mold 80 and the bottom mold 70 as shown in FIG. 4. Exemplarily, transfer molding or any other suitable molding or casting technique known to a person skilled in the art may be used as a molding or casting technique for molding or casting the encapsulation 50.

The step (c) of providing the second semiconductor module 200 comprises similar method steps and features as the step (b) described above. Accordingly, a description thereof will not be repeated but it is referred to the above description of step (b).

In the step (d) of attaching the first power semiconductor module 100 to the frame 20 the first power semiconductor module 100 provided in step (b) is inserted with its cooling extensions 37 and part of the first base plate 30 into the first opening 23 such that the first portion 21 of the plate portion 22 is received in the first recess 35 as shown in any one of FIGS. 5A to 5C. Then the first portion 21 is fixed to the first base plate 30 by welding or another bonding technique such as gluing or soldering. If the first base plate 30 is made of AlSiC an aluminium rich portion (which has exemplarily a thickness of 5 mm) may be integrated in the first base plate 30 where the welding connection is to be formed. In the embodiment illustrated in FIG. 5A the first portion 21 is fixed to the first base plate 30 by laser welding. The laser beam 90 used for the laser welding is indicated as an arrow in FIG. 5A. In particular, the laser beam 90 is directed to an area at the gap between the step 35A and a lateral edge portion of the first portion 21 to form a butt weld connection between the first portion 21 and the first base plate 30. Fixing the first portion 21 to the first base plate by a butt weld connection has the advantage that it closes the gap between the step 35A and a lateral edge of the first portion 21 to provide a smooth surface for a wall of the cooling channel 65. It is to be noted that due to the rim portion of molded material around the first base plate 30 a butt weld would not be possible without the recess 35 but is made possible only due to the first portion 21 being received in the first recess 35. Alternatively, the first portion 21 may be fixed to the first plate 30 by welding in another area than at the gap between the step 35A and a lateral edge of the first portion 21. For example such welding could be performed also by laser welding through the first portion 21 or by a friction stir welding technique illustrated in FIG. 5B which shows a friction stir welding device 92. Alternatively, the first portion may be fixed to the first plate portion by a bonding technique as illustrated in FIG. 5C which shows a bonding layer 94. The bonding layer 94 may be made of a solder or glue, for example.

Attaching the second power semiconductor module 200 to the frame 20 in step (e) is performed in the same manner as attaching the first power semiconductor module 100 to the frame 20 in step (d). Accordingly, a description thereof will not be repeated but it is referred to the above description of step (d) with reference to FIGS. 5A to 5B.

By attaching the cooler cover 60 to the frame 20 a bottom wall of a fluid channel 65 is formed to close the fluid channel 65 as shown in FIG. 1C.

It will be apparent for persons skilled in the art that modifications of the above described embodiment are possible without departing from the scope of the invention as defined by the appended claims.

In the above embodiments the electric power converter device 1 was described with two power semiconductor modules 100 and 200. However, the electric power converter device may alternatively include only one power semiconductor module or may alternatively include more than two power semiconductor modules. For example, the invention may be applied to a two-level traction inverter for electric vehicles comprising six functional power semiconductor switches implemented as six power semiconductor modules. Such two-level traction inverter may exemplarily include three power-semiconductor modules, each containing two functional switches.

Also, in the above embodiments the first and the second power semiconductor modules have been described to be substantially identical. However, in case that the electric power converter includes plural power semiconductor modules these power semiconductor modules must not necessarily be identical but can be different from each other. In particular, these plural power semiconductor modules may have different dimensions.

In the above embodiments the side wall portion 24 was described as a part of the frame 20. However, the side wall portion 24 may also be a part of the cooler cover 60.

In the above described embodiment of the electric power converter device 1 the bottom surface 21A of the first portion 21 is flush with the second main side 33 of the first base plate 30 adjacent to the first step 35A. However, the bottom surface 21A of the first portion 21 is not necessarily flush with the second main side 33 of the first base plate 30 adjacent to the first step 35A. Likewise, the depth of the first recess 35 is not necessarily the same as the thickness of the first portion 21 of the frame 20.

In the above embodiment for manufacturing the electric power converter device of the invention molding or casting the encapsulation 50 was performed individually for each power semiconductor module before attaching the first and the second power semiconductor module 100, 200 to the frame 20. This has the advantage that the power semiconductor modules may be tested prior to integration with the frame 20. However, it would also be possible to form the encapsulation only after attaching the power semiconductor module(s) to the frame 20.

It should be noted that the term "comprising" does not exclude other elements or steps and that the indefinite article "a" or "an" does not exclude the plural. Also elements described in association with different embodiments may be combined.

LIST OF REFERENCE SIGNS 1 electric power converter device
100 first power semiconductor module
100' preliminary first power semiconductor module
20, 20' frame
200 second power semiconductor module
21A bottom surface
21 first portion
21' second portion
22 plate portion
23 first opening
23' second opening
24 side wall portion
30 first base plate
30' second base plate
32 first main side
32' third main side
33 second main side
33' fourth main side
34, 34' lateral side surface
35 first recess
35' second recess
35A first step
37 cooling extension
40 first die
42 substrate
44 bonding wire
50 encapsulation
60 cooler cover
65 fluid channel
70 bottom mold
70A first flat surface
80 top mold
d1 first thickness
d2 second thickness
d3 third thickness

The invention claimed is:

1. An electric power converter device, comprising:
a first power semiconductor module;
a frame for a closed cooler,
the first power semiconductor module including
a first base plate having a first main side, a second main side opposite the first main side and a lateral side surface extending along a circumferential edge of the first base plate and connecting the first main side and the second main side; and
at least one first die located on the first main side of the first base plate,
wherein the frame is attached to the second main side of the first base plate, and the first base plate has a first step on the second main side along the circumferential edge of the first base plate to form a first recess along the circumferential edge of the first base plate, wherein in the first recess a first portion of the frame is received, wherein the first base plate is made of aluminum silicon carbide (AlSiC), or a combination of copper and aluminum, and the first portion of the frame is fixed to the first base plate by a welding connection which is a butt weld produced by laser welding; and
a molded encapsulation, which encapsulates the first main side and the lateral side surface of the first base plate such that a bottom surface of the encapsulation is flush with the first base plate at the circumferential edge of the first base plate on the second main side.

2. The electric power converter device according to claim 1, wherein the first portion of the frame is a flange portion that is received in the first recess such that a bottom surface of the flange portion is flush with the second main side of the first base plate adjacent to the first step.

3. The electric power converter device according to claim 2, wherein the first base plate has a reduced first thickness along its circumferential edge compared to a second thickness of the first base plate in a central area of the first base plate, wherein the central area is laterally surrounded by the first step.

4. The electric power converter device according to claim 2, comprising a plurality of cooling extensions protruding from the second main side of the first base plate in a central area of the first base plate, wherein the central area is laterally surrounded by the first step.

5. The electric power converter device according to claim 2, wherein the frame has a plate portion that comprises an opening and wherein an edge portion of the plate portion, which is directly adjacent to the opening and which surrounds the opening, is the first portion of the frame.

6. The electric power converter device according to claim 1, wherein the first base plate has a reduced first thickness along its circumferential edge compared to a second thickness of the first base plate in a central area of the first base plate, wherein the central area is laterally surrounded by the first step.

7. The electric power converter device according to claim 6, comprising a plurality of cooling extensions protruding from the second main side of the first base plate in a central area of the first base plate, wherein the central area is laterally surrounded by the first step.

8. The electric power converter device according to claim 6, wherein the frame has a plate portion that comprises an opening and wherein an edge portion of the plate portion, which is directly adjacent to the opening and which surrounds the opening, is the first portion of the frame.

9. The electric power converter device according to claim 1, comprising a plurality of cooling extensions protruding from the second main side of the first base plate in a central area of the first base plate, wherein the central area is laterally surrounded by the first step.

10. The electric power converter device according to claim 9, wherein the frame has a plate portion that comprises an opening and wherein an edge portion of the plate portion, which is directly adjacent to the opening and which surrounds the opening, is the first portion of the frame.

11. The electric power converter device according to claim 1, wherein the frame has a plate portion that comprises an opening and wherein an edge portion of the plate portion, which is directly adjacent to the opening and which surrounds the opening, is the first portion of the frame.

12. The electric power converter device according to claim 11, wherein the plate portion has a third thickness which is the same as a depth of the first recess in the first base plate.

13. The electric power converter device according to claim 1, comprising a cooler cover attached to the frame at a side opposite to the first base plate to form a bottom wall portion of a fluid channel in the closed cooler.

14. The electric power converter device according to claim 1, comprising at least one second power semiconductor module, the second power semiconductor module including:
a second base plate having a third main side and a fourth main side opposite the third main side; and
at least one second die located on the third main side of the second base plate,
wherein the frame is attached to the fourth main side of the second base plate, and
wherein the second base plate has a second step on the fourth main side along a circumferential edge of the second base plate to form a second recess along the circumferential edge of the second base plate in which a second portion of the frame is received.

* * * * *